(12) United States Patent
Kao et al.

(10) Patent No.: US 8,759,118 B2
(45) Date of Patent: Jun. 24, 2014

(54) PLATING PROCESS AND STRUCTURE

(75) Inventors: Chin-Fu Kao, Taipei (TW); Cheng-Lin Huang, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 195 days.

(21) Appl. No.: 13/297,845

(22) Filed: Nov. 16, 2011

(65) Prior Publication Data

US 2013/0119382 A1  May 16, 2013

(51) Int. Cl.
*H01L 21/66* (2006.01)
*H01L 23/58* (2006.01)

(52) U.S. Cl.
USPC .............................................. 438/14; 257/48

(58) Field of Classification Search
USPC ............ 438/10–18; 257/48, E21.521, E21.53
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,241,212 A * | 8/1993 | Motonami et al. | 257/529 |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |

(Continued)

*Primary Examiner* — Calvin Lee
(74) *Attorney, Agent, or Firm* — Slater and Matsil, L.L.P.

(57) ABSTRACT

A system and method for plating a contact is provided. An embodiment comprises forming protective layers over a contact and a test pad, and then selectively removing the protective layer over the contact without removing the protective layer over the test pad. With the protective layer still on the test pad, a conductive layer may be plated onto the contact without plating it onto the test pad. After the contact has been plated, the protective layer over the contact may be removed.

20 Claims, 3 Drawing Sheets

(56) References Cited

U.S. PATENT DOCUMENTS

| | | | |
|---|---|---|---|
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 7,947,978 B2 * | 5/2011 | Lin et al. | 257/48 |
| 8,013,333 B2 * | 9/2011 | Chen et al. | 257/48 |
| 2007/0114671 A1 | 5/2007 | Hsu et al. | |
| 2009/0057726 A1 | 3/2009 | Ohnuma et al. | |
| 2011/0024901 A1 | 2/2011 | Yamashita et al. | |
| 2012/0146085 A1 | 6/2012 | Park et al. | |

\* cited by examiner

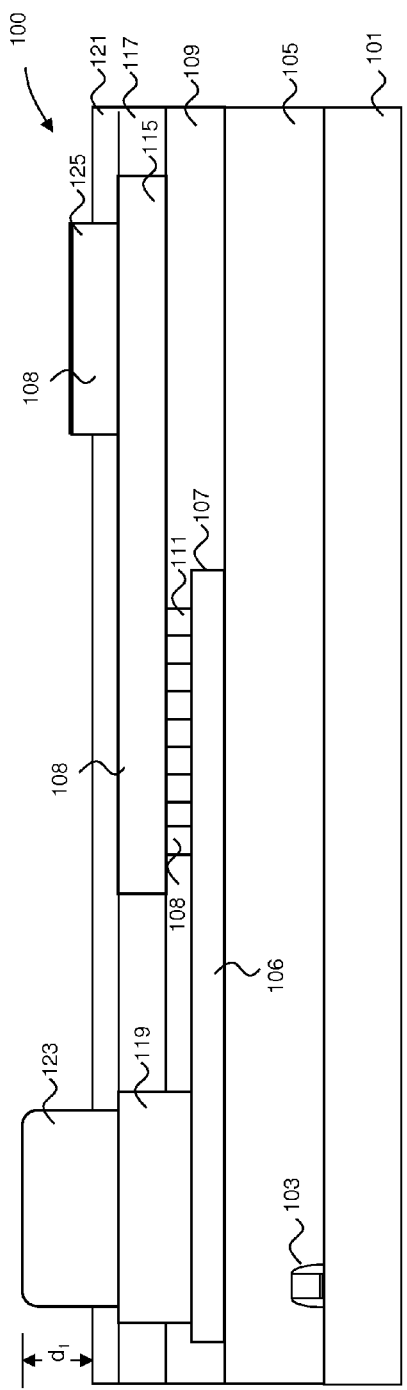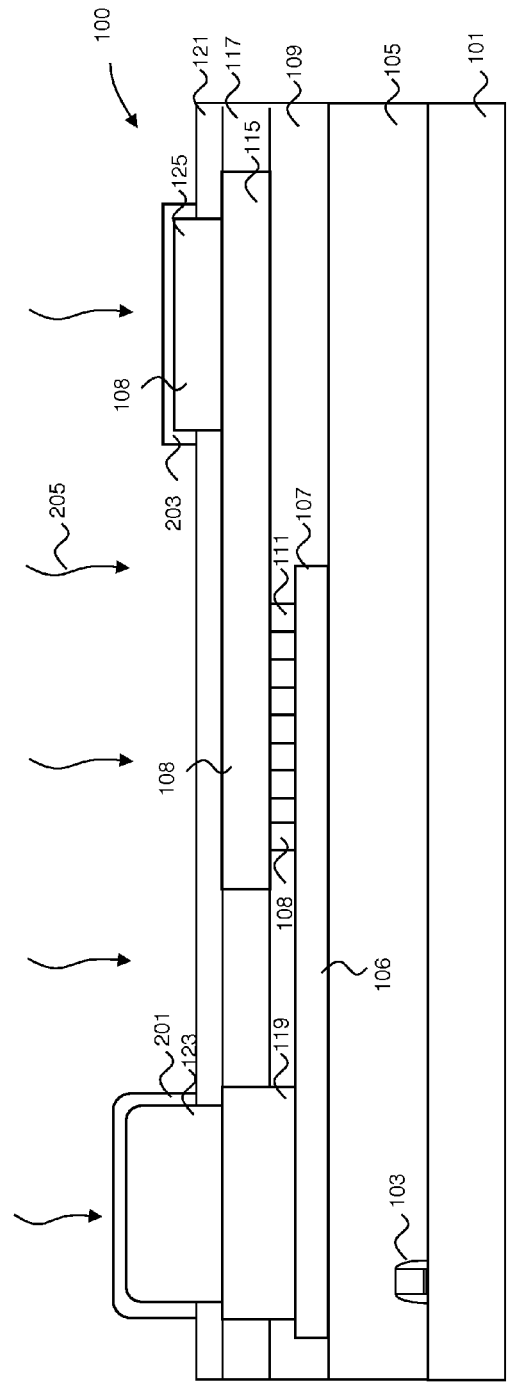

PLATING PROCESS AND STRUCTURE

BACKGROUND

Generally, multiple semiconductor dies may be manufactured concurrently with each other by forming the dies at the same time on a semiconductor wafer. The semiconductor dies may contain multiple devices such as transistors, resistors, capacitors, inductors, and the like, using, e.g., a combination of implantation, deposition, masking, etching, annealing, and passivating steps during the manufacturing process. Once formed, these devices may be connected to each to form functional units and circuits using alternating layers of metallization and dielectric layers. Contacts may be formed in connection with the metallization layers in order to provide an external connection between the devices within the semiconductor dies and the individual semiconductor dies may be singulated from the wafer so that the semiconductor dies may be integrated as part of a larger system.

Additionally, at some point during the manufacture of the semiconductor dies, it may be desirable to test the semiconductor dies and determine if the semiconductor dies are suitable for further processing. To provide inputs to the semiconductor dies for the tests, special test pads may be manufactured on the semiconductor wafer in order to provide an electrical contact point for a test probe. These test pads may be formed to electrically connect to the same electrical points as respective contact pads, thereby providing an alternate electrical path to the underlying devices formed within the semiconductor dies.

During testing, the test probes may be placed into contact with the test pads in order to provide external connections to the semiconductor die. These external connections may be used to input a predetermined series of test signals or else to receive output from the semiconductor die after they have processed the signals that were input. These output signals may then be analyzed to determine whether the individual semiconductor dies have passed the test.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a semiconductor device with a contact and a test pad in accordance with an embodiment;

FIG. 2 illustrates the formation of a first protective layer and a second protective layer in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
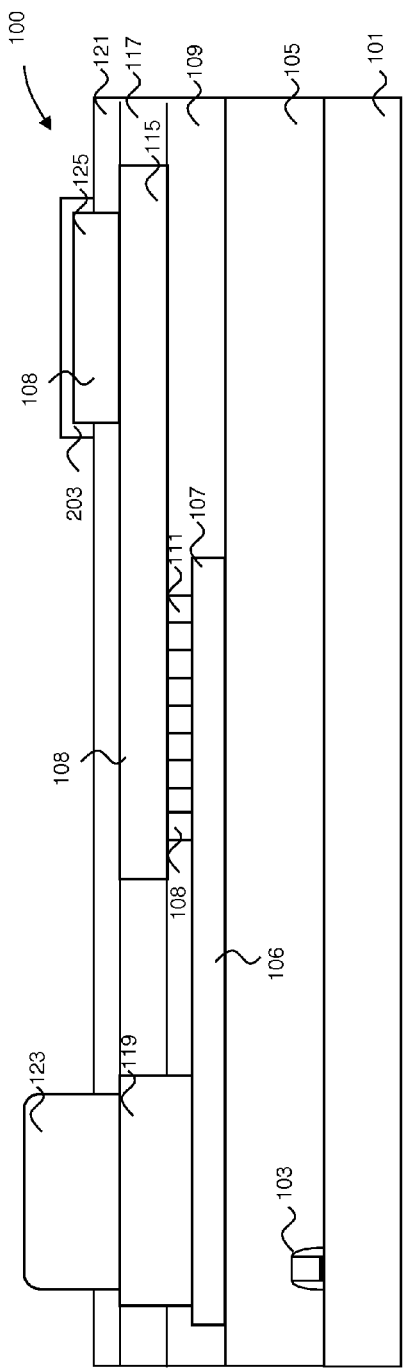
FIG. 3 illustrates the removal of the first protective layer in accordance with an embodiment.

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a method of plating a contact that is connected to a test pad on a semiconductor device. The embodiments may also be applied, however, to other plating methods.

With reference now to FIG. 1, there is shown a semiconductor device 100 with a substrate 101, active devices 103, intermediate metallization layers 105, an upper metallization layer 107, an interlayer dielectric (ILD) layer 109 over the upper metallization layer 107, vias 111 through the ILD layer 109, a first passivation layer 117, a redistribution line 115 formed in the first passivation layer 117, a contact pad 119, a second passivation layer 121, a contact 123, and a test pad 125. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include glass substrates, multi-layered substrates, gradient substrates, or hybrid orientation substrates.

The active devices 103 are represented in FIG. 1 as a single transistor on the substrate 101. However, as one of ordinary skill in the art will recognize, a wide variety of passive and active devices such as transistors, capacitors, resistors, inductors, combinations of these, or the like may be used to generate the desired structural and functional requirements of the overall design of the semiconductor device 100. The active devices 103 may be formed using any suitable methods either within or on the surface of the substrate 101.

The intermediate metallization layers 105 may be formed over the active devices 103 and are designed to connect the various active devices 103 to form functional circuitry. The intermediate metallization layers 105 may also be used to connect the active devices 103 to the contact 123 (discussed further below) so that the active devices 103 may receive input signals or send output signals through the contact 123. The intermediate metallization layers 105 may be formed of alternating layers of dielectric (e.g., low-k dielectric material) and conductive material (e.g., copper) and may be formed through any suitable process (such as deposition, damascene, dual damascene, etc.).

The upper metallization layer 107 may be formed over and in electrical contact with the conductive material within the intermediate metallization layers 105 in order to provide a connection between the active devices 103 and the contact 123. Additionally, the upper metallization layer 107 may also connect the active devices 103 to the test pad 125, providing an alternative path for signals while the semiconductor device is being tested. The upper metallization layer 107 may be formed of a first conductive material 106 with a first reduction potential. In an embodiment, the first conductive material 106 may comprise copper, which has a reduction potential of −0.34 V. However, any other suitable conductive material, such as tungsten, aluminum, or the like, may alternatively be utilized. In an embodiment in which the first conductive material 106 is copper, the upper metallization layer 107 may be formed by initially forming a seed layer (not individually shown in FIG. 1) of a titanium copper alloy through a suitable formation process such as CVD or sputtering. A first photoresist (not shown in FIG. 1) may then be formed to cover the seed layer, and the first photoresist may then be patterned to expose those portions of the seed layer that are located where the upper metallization layer 107 is desired to be located.

Once the first photoresist has been formed and patterned, the first conductive material 106 (e.g., copper), may be formed on the seed layer through a deposition process such as plating. The first conductive material 106 may be formed to have a thickness of between about 1 μm and about 10 μm, such as about 5 μm. However, while the methods discussed are suitable to form the first conductive material 106 and the upper metallization layer 107, these methods are merely exemplary. Any other suitable processes of formation, such as CVD or PVD, may alternatively be used to form the upper metallization layer 107.

Once the first conductive material 106 has been formed, the first photoresist may be removed through a suitable removal process. In an embodiment the first photoresist may be removed through a process such as ashing, whereby the temperature of the first photoresist is increased until the first photoresist decomposes and may be removed. Additionally, after the removal of the first photoresist, those portions of the seed layer that were covered by the first photoresist may be removed through, for example, a suitable etch process using the first conductive material 106 as a mask.

After the upper metallization layer 107 has been formed, the ILD layer 109 may be formed over the upper metallization layer 107 in order to protect the upper metallization layer 107 and other underlying structures. The ILD layer 109 may be formed over the upper metallization layer 107 and may comprise an oxide that may be formed either by chemical vapor deposition (CVD) techniques using tetra-ethyl-ortho-silicate (TEOS) and oxygen as a precursor, or else by plasma enhanced chemical vapor deposition (PECVD). However, other methods and materials known in the art may be used. In an embodiment, the ILD layer 109 may be between about 4,000 Å and about 13,000 Å in thickness, but other thicknesses may be used. The surface of the ILD layer 109 may be planarized, such as by a CMP process using an oxide slurry.

Once the ILD layer 109 has been formed, the vias 111 may be formed to extend through the ILD layer 109 in order to provide a connection between the upper metallization layer 107 and the test pad 125 (discussed further below). The vias 111 may comprise a second conductive material 108 that has a higher reduction potential than the first conductive material 106. In an embodiment in which the first conductive material 106 is copper (with a reduction potential of −0.34 V), the vias 111 may comprise aluminum, which has a reduction potential of about 1.66 V. However, other materials, such as manganese (with a reduction potential of about 2.38 V), may alternatively be used depending upon the material chosen for the first conductive material 106 and its reduction potential.

The vias 111 may be formed, e.g., by forming openings through the ILD layer 109 for the vias 111 in order to expose a portion of the underlying upper metallization layer 107. In an embodiment the openings through the ILD layer 109 may be formed using, e.g., a suitable photolithographic mask and etching process. After the openings through the ILD layer 109 for the vias 111 have been formed, the openings through the ILD layer 109 may be filled to form the vias 111 using a deposition process such as chemical vapor deposition (CVD), although any other suitable process, such as physical vapor deposition (PVD), plasma enhanced chemical vapor deposition (PECVD), ALD, or any other suitable process, may alternatively be utilized. Once the openings through the ILD layer 109 for the vias 111 have been filled with the second conductive material 108, any of the second conductive material 108 outside of the openings for the vias 111 may be removed, and the vias 111 and the ILD layer 109 may be planarized using, for example, a CMP process.

After the vias 111 have been formed, the first passivation layer 117 may be formed in order to electrically isolate and protect the vias 111 and other underlying structures. In an embodiment the first passivation layer 117 may be formed from a polymer such as polyimide, or may alternatively be formed of materials such as silicon oxides, silicon nitrides, low-k dielectrics, extremely low-k dielectrics, combinations of these, and the like. The first passivation layer 117 may be formed to have a thickness of between about 2 μm and about 15 μm, such as about 5 μm.

After the first passivation layer 117 has been formed, the redistribution line 115 may be formed in the first passivation layer 117 in order to provide a connection between the vias 111 and the test pad 125 (discussed further below). The redistribution line 115 may be formed of the second conductive material 108, such as aluminum, and may be formed by initially forming an opening through the first passivation layer 117 using, e.g., a photolithographic masking and etching process, and then depositing the second conductive material 108 into the opening using, for example, CVD. Once deposited or otherwise formed, any excess material may be removed using, e.g., a CMP process.

However, as one of ordinary skill in the art will recognize, the above described process steps are merely one method that may be used to form the vias 111 and the redistribution line 115. Other methods, such as a forming the ILD layer 109 and the first passivation layer 117 as a single layer and then performing a dual damascene process to form the vias 111 and redistribution line 115 simultaneously, may alternatively be utilized. This method and any other suitable method are fully intended to be included within the scope of the embodiments.

Additionally, the contact pad 119 may also be formed through the first passivation layer 117 and the ILD layer 109. In an embodiment the contact pad 119 may be formed by initially forming an opening through the first passivation layer 117 and the ILD layer 109 using, e.g., a suitable photolithographic and etching process. The opening through the first passivation layer 117 may then be filled, e.g., with the first conductive material 106 using a suitable plating process, such as electroplating, in order to plate the contact pad 119 to the upper metallization layer 107 and also to fill and overfill the opening through the first passivation layer 117. Excess material located outside of the opening through the first passivation layer 117 may then be removed using, e.g., a CMP process.

However, as one of ordinary skill in the art will immediately recognize, the precise process described above with respect to the formation of the redistribution line 115 and the contact pad 119 is merely an illustrative embodiment, and is not meant to be limiting in any fashion. Any suitable order of process steps and any other suitable materials, such as forming the contact pad 119 prior to forming the redistribution line 115, and any other suitable methods than those described above may alternatively be utilized. These and any other such orders or methods are fully intended to be included within the scope of the embodiments.

After the contact pad 119 and the redistribution line 115 have been formed, the second passivation layer 121 may be formed to help isolate and protect the contact pad 119 and the redistribution line 115 and the other underlying structures. In an embodiment the second passivation layer 121 may be formed from a polymer such as polyimide, or may alternatively be formed of materials such as silicon oxides, silicon nitrides, low-k dielectrics, extremely low-k dielectrics, combinations of these, and the like. The second passivation layer 121 may be formed to have a thickness of between about 2 μm and about 15 μm, such as about 5 μm.

After the second passivation layer 121 has been formed over the redistribution line 115 and the contact pad 119, the test pad 125 and the contact 123 may be formed through the second passivation layer 121. In an embodiment the test pad 125 may be formed of the second conductive material 108, such as aluminum, and may be formed by first forming an opening through the second passivation layer 121 to expose a portion of the redistribution line 115. Once the opening through the second passivation layer 121 has been formed, the test pad 125 may be formed by filling the opening through the second passivation layer 121 with the second conductive material 108 using a process such as CVD, although any suitable process of formation, such as PVD, ALD, or the like, may alternatively be utilized. Excess material from outside of the opening through the second passivation layer 121 may be removed, utilizing, e.g., a suitable removal process such as CMP or etching, and the second passivation layer 121 may optionally be recessed so that the test pas 125 extends beyond the second passivation layer 121.

However, as one of ordinary skill in the art will recognize, the above described process for forming the test pad 125 through the second passivation layer 121 is merely illustrative and is not intended to limit the embodiments. Alternative methods, such as depositing a layer of the second conductive material 108, patterning the second conductive material 108 to form the test pad 125, forming the second passivation layer 121 over the test pad 125, and then exposing the test pad 125 through the second passivation layer 121, may also be utilized. This method and any other suitable methods may alternatively be utilized, and are fully intended to be included within the scope of the embodiments.

The contact 123 may be, e.g., a conductive pillar, and may be formed to provide conductive regions for contact between the contact pad 119 and an external device (not shown in FIG. 1) such as printed circuit boards or other semiconductor dies in, e.g., a flip-chip arrangement. The contact 123 may be formed by initially forming a second photoresist (not shown) over the second passivation layer 121 to a thickness greater than about 20 μm, or even greater than about 60 μm. The second photoresist may be patterned to expose portions of the second passivation layer 121 through which the contact 123 will extend. Once patterned, the second photoresist may then be used as a mask to remove the desired portions of the second passivation layer 121, thereby exposing those portions of the underlying contact pad 119 to which the contact 123 is formed.

After the second passivation layer 121 has been patterned, the contact 123 may be formed within the openings of both the second passivation layer 121 as well as the second photoresist. The contact 123 may be formed from the first conductive material 106, such as copper. Additionally, the contact 123 may be formed using a process such as electroplating, by which an electric current is run through the contact pad 119 and the contact pad 119 is immersed in a solution. The solution and the electric current deposit, e.g., the first conductive material 106, within the opening in order to fill and/or overfill the openings through the second photoresist and the second passivation layer 121, thereby forming the contact 123. Excess conductive material outside of the openings through the second photoresist and the second passivation layer 121 may then be removed using, for example, a chemical mechanical polish (CMP).

After the contact 123 has been formed, the photoresist may be removed through a process such as ashing, whereby the temperature of the photoresist is increased until the photoresist decomposes and may be removed. After the removal of the photoresist, the contact 123 may extend away from the second passivation layer 121 a first distance $d_1$ of between about 3 μm to about 50 μm, such as 5 μm.

However, as one of ordinary skill in the art will recognize, the above described process to form the contact 123 as a conductive pillar is merely one such description, and is not meant to limit the embodiments to this exact process. Rather, the described process is intended to be merely illustrative, as any suitable process for forming the contact 123 may alternatively be utilized. For example, forming the second passivation layer 121 to a thickness greater than its eventual thickness, forming the contact 123 into an opening of the second passivation layer 121, and then removing a top portion of the second passivation layer 121 such that the contact 123 extends away from the second passivation layer 121 may also be utilized. This process and any other suitable processes may alternatively be utilized to form the contact 123, and all suitable processes are fully intended to be included within the scope of the embodiments.

FIG. 2 illustrates the formation of a first protective layer 201 over the contact 123 and the formation of a second protective layer 203 over the test pad 125. In an embodiment the formation of the first protective layer 201 and the second protective layer 203 may be initiated by performing an initial pre-cleaning operation. The pre-cleaning operation may be, e.g., a brush or scrubbing clean in which the contact 123, the test pad 125 and the second passivation layer 121 are physically scrubbed using, e.g., a brush cleaning process or a pencil cleaning process, in order to remove any particles or other impurities that may be located on the contact 123 or the test pad 125. By removing these particles or other impurities, the first protective layer 201 and the second protective layer 203 may be formed in a more controlled manner.

After the pre-cleaning process has removed or reduced the particles and other impurities, the first protective layer 201 and the second protective layer 203 may be formed, for example, by exposing the contact 123 and the test pad 125 to a reactant (represented in FIG. 2 by the wavy lines labeled 205) to chemically modify the contact 123 and the test pad 125. In an embodiment the first protective layer 201 and the second protective layer 203 may be formed by oxidizing the contact 123 and the test pad 125, respectively, with a reactant such as oxygen/nitrogen plasma, although other suitable processes may alternatively be utilized. For example, the test pad 125 and contact 123 may be exposed to other reactants such as non-plasma oxygen, water, an oxidizing agent such as hydrogen peroxide$_{(aq.)}$ ($H_2O_2$) or sodium persulfate$_{(aq.)}$ (SPS). The passivation operation may be, e.g., an oven curing process under an oxygen-rich or nitrogen-rich condition to form a chemically passive layer to resist electron transportation forced by reduction potential voltage. In these embodiments the passivation operation may be performed for a time period of between about 30 sec and about 3 hours, such as about 10 minutes, at a temperature of between about 30° C. and about 300° C., such as about 120° C. and a pressure of between about 760 torr and about 1E-2 torr, such as about 1 torr.

By subjecting the exposed surfaces of the test pad 125 and the contact 123 to such an oxidizing environment, the exposed surfaces of the test pad 125 and the contact 123 will react with the oxygen to form the first protective layer 201 and the second protective layer 203, respectively. As such, the first protective layer 201 may be formed from oxidizing the first conductive material 106 that is exposed on the surface of the contact 123 and the second protective layer 203 may be formed from oxidizing the second conductive material 108 that is exposed on the surface of the test pad 125. In an embodiment the oxidation process may be continued until the first protective layer 201 and the second protective layer 203 have a thickness of between about 1 nm and about 100 nm, such as about 20 nm.

As an example, in an embodiment in which the contact 123 is copper and the test pad 125 is aluminum, the contact 123 may be exposed to oxygen plasma to form the first protective layer 201 comprising copper oxide. Similarly, the test pad 125 may be exposed to oxygen plasma to form the second protective layer 203 comprising aluminum oxide. Because the first protective layer 201 and the second protective layer 203 are formed from the contact 123 and the test pad 125, respectively, the first protective layer 201 and the second protective layer 203 form on all of the exposed surfaces of the contact 123 and the test pad 125, respectively, including the exposed sidewalls.

FIG. 3 illustrates a selective removal of the first protective layer 201 from the contact 123 without significantly removing the second protective layer 203 from the test pad 125. This selective removal of the first protective layer 201 may be performed using a removal process that is selective towards the material of the first protective layer 201 relative to the second protective layer 203. In an embodiment in which the first protective layer 201 is copper oxide and the second protective layer 203 is aluminum oxide, the removal process may comprise a microetch such as a wet etch that utilizes an etchant that selectively removes copper oxide in relation to aluminum oxide. For example, an acid-base solution comprising sulfuric acid ($H_2SO_4$) may be utilized in which the sulfuric acid has a concentration of between about 5% and about 50%, such as about 10%, although any other suitably selective etchant or other process may alternatively be utilized.

Figure 4:
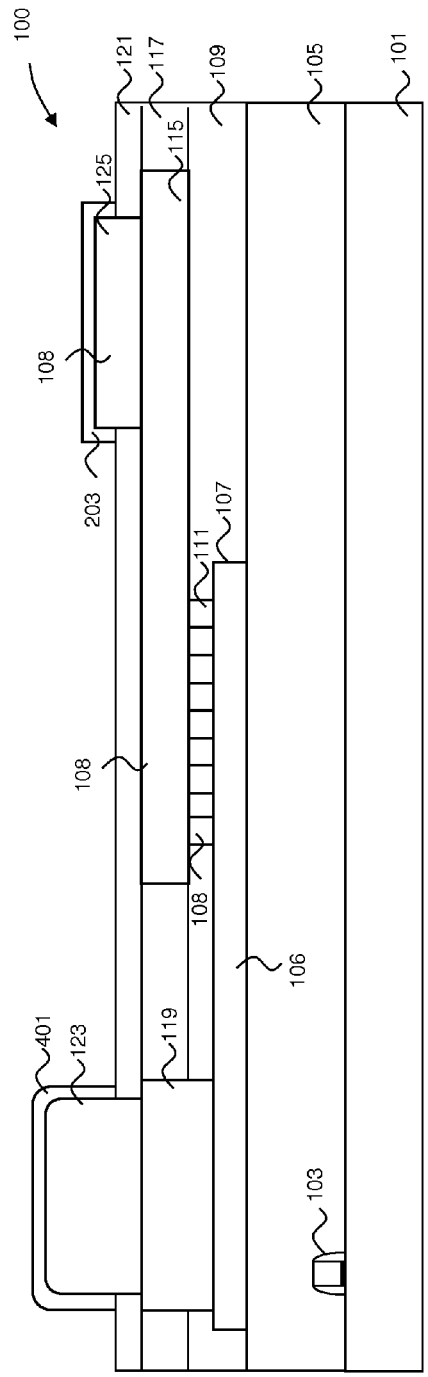
FIG. 4 illustrates the formation of a conductive layer over the contact in accordance with an embodiment.

FIG. 4 illustrates a formation of a conductive layer 401 over the contact 123. The conductive layer 401 may be formed, e.g., in a process such as an electroless nickel electroless palladium immersion gold (ENEPIG) process, in which a series of electroless plating processes are utilized to form a series of layers over the contact 123 in order to protect and provide the connective surfaces of the contact 123. As an example only, a first electroless plating process may be utilized to form a layer of nickel (not individually illustrated in FIG. 4) onto the surface of the contact 123, a second electroless plating process may be utilized to form a layer of palladium (not individually illustrated in FIG. 4), and a third electroless plating process may be utilized to form a layer of gold onto the layer of palladium.

However, as one of ordinary skill in the art will recognize, the ENEPIG process utilized in the above described embodiment is not the only embodiment that may be utilized to form the conductive layer 401. Any other suitable process, such as electroless nickel immersion gold (ENIG), electroless nickel electroless palladium (ENEP), organic solderability preservative (OSP), immersion tin (IT), immersion gold (IG), Al, Sn, Ni, Au, Ag, or other suitable electrically conductive materials and processes may alternatively be utilized. These and any other suitable immersion processes to form the conductive layer 401 on the contact 123 may alternatively be utilized, and are fully intended to be included within the scope of the present embodiments.

During the formation of the conductive layer 401, the test pad 125 remains protected by the second protective layer 203. If the second protective layer 203 were not present, a galvantic circuit may be created between the contact 123, the immersion solutions of, e.g., the ENIPIG process, the test pad 125, and the interconnects connecting the test pad 125 back to the contact 123 (e.g., the redistribution layer 115, the vias 111, the upper metallization layer 107, and the contact pad 119). This galvanic circuit could generate galvanic effects and attack and degrade the test pad 125 during the plating process.

However, because of the presence of the second protective layer 203 over the test pad 125, the chemical potential of the surface of the test pad 125 is degraded by its oxidation to form the second protective layer 203. This degradation of the chemical potential of the surface of the test pad 125 helps to break or reduce the external path of the galvantic circuit between the contact 123, the immersion solutions, and the test pad 125. With the galvanic circuit path broken or reduced, the galvanic effects may be reduced or eliminated, thereby helping to preserve the test pad 125 during the plating process.

Additionally, with the use of the second protective layer 203, the use of a photoresist to protect the test pad 125 during the plating process may be avoided. By removing the use of a photoresist at this stage, there are no problems associated with the photoresist leaching into the immersion solutions of, e.g., the ENEPIG process, leading to a more controlled and efficient process. Also, because the photoresist is not needed, the photoresist will also not cover the sidewalls of the contact 123 during the plating process, allowing the plating process to also cover the sidewalls of the contact 123 and protect the contact 123 during subsequent processing, such as etching, which may otherwise cause eaves under the contact 123 to form and generate particles which could interfere with the manufacturing process.

Figure 5:
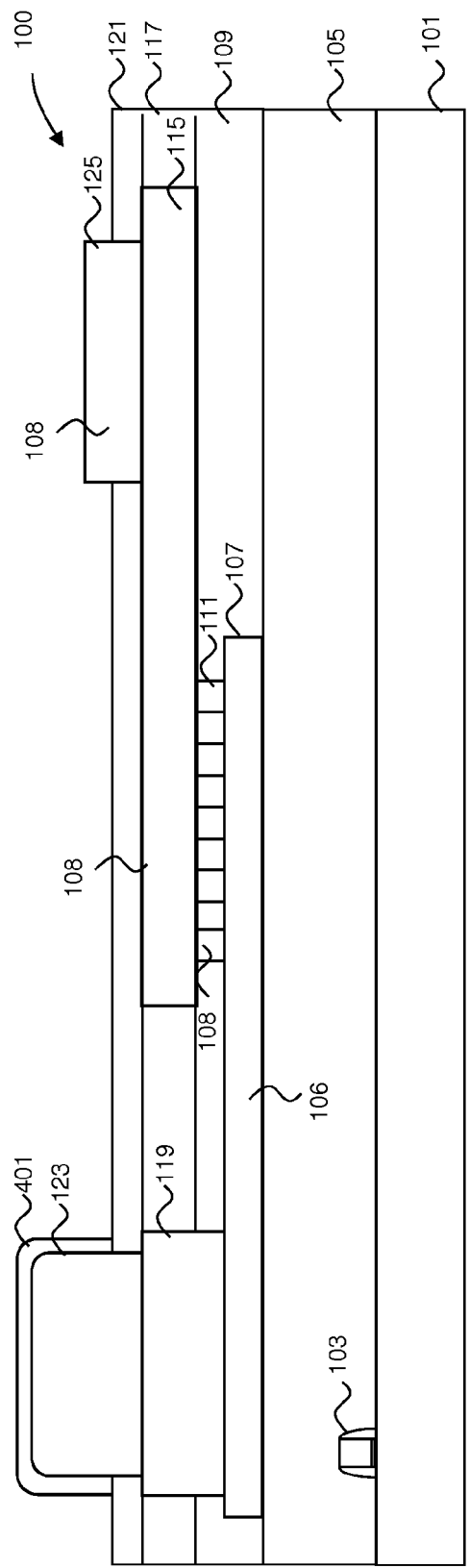
FIG. 5 illustrates the removal of the second protective layer in accordance with an embodiment.

FIG. 5 illustrates the removal of the second protective layer 203 from the test pad 125 after the conductive layer 401 has been formed on the contact 123. In an embodiment the removal may be performed using a process that is selective to the removal of the second protective layer 203 without removing the conductive layer 401. For example, in an embodiment in which the second protective layer 203 is aluminum oxide, a wet etch may be utilized with an alkaline-base etchant such as sodium hydroxide (NaOH). The solution may have a concentration of sodium hydroxide of between about 5% and about 40%, such as about 20%.

By utilizing the second protective layer 203 in order to protect the test pad 125 during the plating of the contact 123, the test pad 125 will avoid a galvantic circuit and prevent damage to the test pad 125 during the plating process. Additionally, without the use of a photoresist to protect the test pad 125 during the plating process, the entire exposed surface of the contact 123 may be plated, and none of the photoresist will be leached into the immersion solutions of the plating processes. All of this may lead to a more efficient, more controlled, and less costly process of forming the conductive layer 401 on the contact 123.

In an embodiment a method for manufacturing a semiconductor device comprising providing a contact and a test pad on a substrate, the contact and the test pad being electrically in contact with each other, is provided. A first protective layer is formed over the contact and a second protective layer over the test pad, the first protective layer being different from the second protective layer. The first protective layer is removed from the contact without removing the second protective layer from the test pad, and a conductive layer is formed over the contact while the second protective layer is on the test pad.

In another embodiment a method for manufacturing a semiconductor device comprising providing a contact and a test pad on a substrate, the contact and the test pad being electrically in contact with each other, is provided. A first protective layer is formed from a portion of the test pad, and a conductive layer is formed over the contact while the first protective layer is on the test pad.

In yet another embodiment a semiconductor device comprising a contact on a substrate and a test pad on the substrate, the test pad being electrically connected to the contact, is provided. A conductive layer is located over the contact but not extending between the contact and the test pad, and a non-conductive protective layer is over the test pad.

Although the embodiments invention and their advantages have been described in detail, it should be understood that various changes, substitutions and alterations can be made herein without departing from the spirit and scope of the embodiments as defined by the appended claims. For example, it will be readily understood by those skilled in the art that the precise materials and processes may be varied from those described in the above embodiments while remaining within the scope of the present embodiments.

Moreover, the scope of the present application is not intended to be limited to the particular embodiments of the process, machine, manufacture, and composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing a semiconductor device, the method comprising:
    forming a first protective layer from a first portion of a contact located on a substrate;
    forming a second protective layer from a second portion of a test pad located on the substrate, wherein the test pad is in electrical contact with the contact;
    selectively removing the first protective layer without removing the second protective layer; and
    plating the contact with a conductive material while the second protective layer remains on the test pad.

2. The method of claim 1, further comprising removing the second protective layer after the plating the contact.

3. The method of claim 2, wherein the removing the second protective layer further comprises exposing the second protective layer to a solution comprising sodium hydroxide.

4. The method of claim 1, wherein the forming the first protective layer and the forming the second protective layer further comprises exposing the first portion and the second portion to an oxygen plasma.

5. The method of claim 1, wherein the contact comprises copper and the test pad comprises aluminum.

6. The method of claim 1, further comprising pre-cleaning the contact and the test pad prior to the forming the first protective layer.

7. A method for manufacturing a semiconductor device, the method comprising:
    providing a contact and a test pad on a substrate, the contact and the test pad being electrically in contact with each other;
    forming a first protective layer from a portion of the test pad;
    forming a second protective layer from a portion of the contact;
    removing the second protective layer from the contact; and
    plating a conductive layer over the contact after the removing the second protective layer while the first protective layer is on the test pad.

8. The method of claim 7, wherein the forming the second protective layer occurs in the same process as the forming the first protective layer.

9. The method of claim 7, wherein the removing the second protective layer comprises etching the second protective layer with a solution comprising sulfuric acid.

10. The method of claim 7, further comprising removing the first protective layer from the test pad after the plating the conductive layer.

11. The method of claim 10, wherein the removing the first protective layer further comprises etching the first protective layer with a solution comprising sodium hydroxide.

12. The method of claim 7, wherein the plating the conductive layer comprises an electroless immersion process.

13. The method of claim 7, wherein the forming the first protective layer further comprises oxidizing the portion of the test pad.

14. The method of claim 7, wherein the forming the first protective layer further comprises a pre-cleaning process.

15. A method of manufacturing a semiconductor device, the method comprising:
    providing a test pad and a contact on a substrate;
    modifying a portion of the test pad to form a first protective layer;
    modifying a portion of the contact to form a second protective layer;
    removing the second protective layer from the contact while leaving the first protective layer on the test pad; and
    plating a conductive material onto the contact after the removing the second protective layer, wherein an electrical path through the substrate electrically connects the contact and the test pad.

16. The method of claim 15, wherein the modifying the portion of the contact occurs in the same process as the modifying the portion of the test pad.

17. The method of claim 16, wherein the removing the second protective layer comprising etching the second protective layer with a solution comprising sulfuric acid.

18. The method of claim 15, further comprising removing the first protective layer from the test pad after the plating the conductive material.

19. The method of claim 18, wherein the removing the first protective layer further comprises etching the first protective layer with a solution comprising sodium hydroxide.

20. The method of claim 15, wherein the modifying the portion of the test pad further comprises oxidizing the portion of the test pad.

* * * * *